(12) United States Patent
Lin et al.

(10) Patent No.: US 10,948,671 B2
(45) Date of Patent: Mar. 16, 2021

(54) TRANSMITTER OPTICAL SUBASSEMBLY (TOSA) WITH LASER DIODE DRIVER (LDD) CIRCUITRY MOUNTED TO FEEDTHROUGH OF TOSA HOUSING

(71) Applicant: Applied Optoelectronics, Inc., Sugar Land, TX (US)

(72) Inventors: Kai-Sheng Lin, Sugar Land, TX (US); Kevin Liu, Houston, TX (US); Hao-Chiang Cheng, Houston, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 16/295,586

(22) Filed: Mar. 7, 2019

(65) Prior Publication Data
US 2020/0285008 A1 Sep. 10, 2020

(51) Int. Cl.
*G02B 6/42* (2006.01)
*H04B 10/40* (2013.01)
*G02B 6/122* (2006.01)

(52) U.S. Cl.
CPC ......... *G02B 6/4279* (2013.01); *G02B 6/1226* (2013.01); *G02B 6/4251* (2013.01); *G02B 6/4271* (2013.01); *H04B 10/40* (2013.01)

(58) Field of Classification Search
CPC .. G02B 6/4201; G02B 6/4279; G02B 6/4284; G02B 6/4244–6/4246; G02B 6/4248; G02B 6/4249; G02B 6/4251; G02B 6/4257; G02B 6/4261; H04B 10/40; H04B 10/506

USPC ........ 385/88, 89, 92, 94; 398/139, 200, 201, 398/212, 214
See application file for complete search history.

(56) References Cited

U.S. PATENT DOCUMENTS 4,826,276 A * 5/1989 Abbott ................. G02B 6/4236
385/138
7,439,449 B1 * 10/2008 Kumar ................. G02B 6/4292
174/254

(Continued)

OTHER PUBLICATIONS

U.S. Office Action dated Jul. 10, 2020, received in U.S. Appl. No. 16/664,202, 16 pgs.

(Continued)

*Primary Examiner* — Robert Tavlykaev
(74) *Attorney, Agent, or Firm* — Grossman Tucker Perreault & Pfleger, PLLC; Norman S. Kinsella

(57) ABSTRACT

The present disclosure is generally directed to a multi-channel TOSA arrangement with a housing that utilizes a feedthrough device with at least one integrated mounting surface to reduce the overall dimensions of the housing. The housing includes a plurality of sidewalls that define a hermetically-sealed cavity therebetween. The feedthrough device includes a first end disposed in the hermetically-sealed cavity of the housing and a second end extending from the cavity away from the housing. The feedthrough device provides the at least one integrated mounting surface proximate the first end within the hermetically-sealed cavity. At least a first laser diode driver (LDD) chip mounts to the at least one integrated mounting surface of the feedthrough device. A plurality of laser arrangements are also disposed in the hermetically-sealed cavity proximate the first LDD chip and mount to, for instance, a LD submount supported by a thermoelectric cooler.

16 Claims, 5 Drawing Sheets

(56) References Cited

U.S. PATENT DOCUMENTS

| | | | | |
|---|---|---|---|---|
| 7,708,565 B2* | 5/2010 | Guja | | G02B 6/4281 |
| | | | | 439/67 |
| 7,941,053 B2* | 5/2011 | Dallesasse | | H04B 10/40 |
| | | | | 398/135 |
| 10,313,024 B1* | 6/2019 | Ho | | H01S 5/042 |
| 10,416,400 B2* | 9/2019 | Yamauchi | | G02B 6/4204 |
| 10,516,487 B1* | 12/2019 | Kang | | G02B 6/4209 |
| 2004/0179562 A1* | 9/2004 | Carroll | | H01S 5/02212 |
| | | | | 372/36 |
| 2004/0184742 A1* | 9/2004 | Sabbatino | | H01S 5/042 |
| | | | | 385/92 |
| 2005/0089280 A1* | 4/2005 | Kumar | | H01S 5/02212 |
| | | | | 385/88 |
| 2005/0191003 A1* | 9/2005 | Yorks | | G02B 6/4201 |
| | | | | 385/14 |
| 2005/0244111 A1* | 11/2005 | Wolf | | G02B 6/4214 |
| | | | | 385/93 |
| 2008/0145060 A1* | 6/2008 | Nelson | | G02B 6/4255 |
| | | | | 398/135 |
| 2013/0001410 A1* | 1/2013 | Zhao | | H05K 1/115 |
| | | | | 250/227.11 |
| 2015/0162990 A1* | 6/2015 | Daiber | | H04B 10/503 |
| | | | | 398/183 |
| 2015/0304053 A1* | 10/2015 | Pfnuer | | G02B 6/4214 |
| | | | | 398/212 |
| 2016/0266335 A1* | 9/2016 | Durrant | | G02B 6/4448 |
| 2016/0291265 A1* | 10/2016 | Kinghorn | | H01L 25/162 |
| 2018/0278019 A1* | 9/2018 | Yamauchi | | H01S 5/0612 |
| 2019/0007154 A1* | 1/2019 | Nakayama | | G02B 6/4261 |
| 2019/0052049 A1* | 2/2019 | Sato | | H01S 5/02252 |
| 2019/0132941 A1* | 5/2019 | Mu | | H05K 1/0219 |
| 2019/0173604 A1* | 6/2019 | Xie | | H04Q 11/0062 |

OTHER PUBLICATIONS

"Tungsten/Copper (W60/Cu40) Material Information", http://www.goodfellow.com/A/Tungsten-Copper.html, Jul. 6, 2020, 3 pgs.

"Alumina-Aluminium Oxide-Al2O3—A Refractory Ceramic Oxide", http://www.axom.com/properties.aspxArticle/D=52, Jul. 6, 2020, 6 pgs.

* cited by examiner

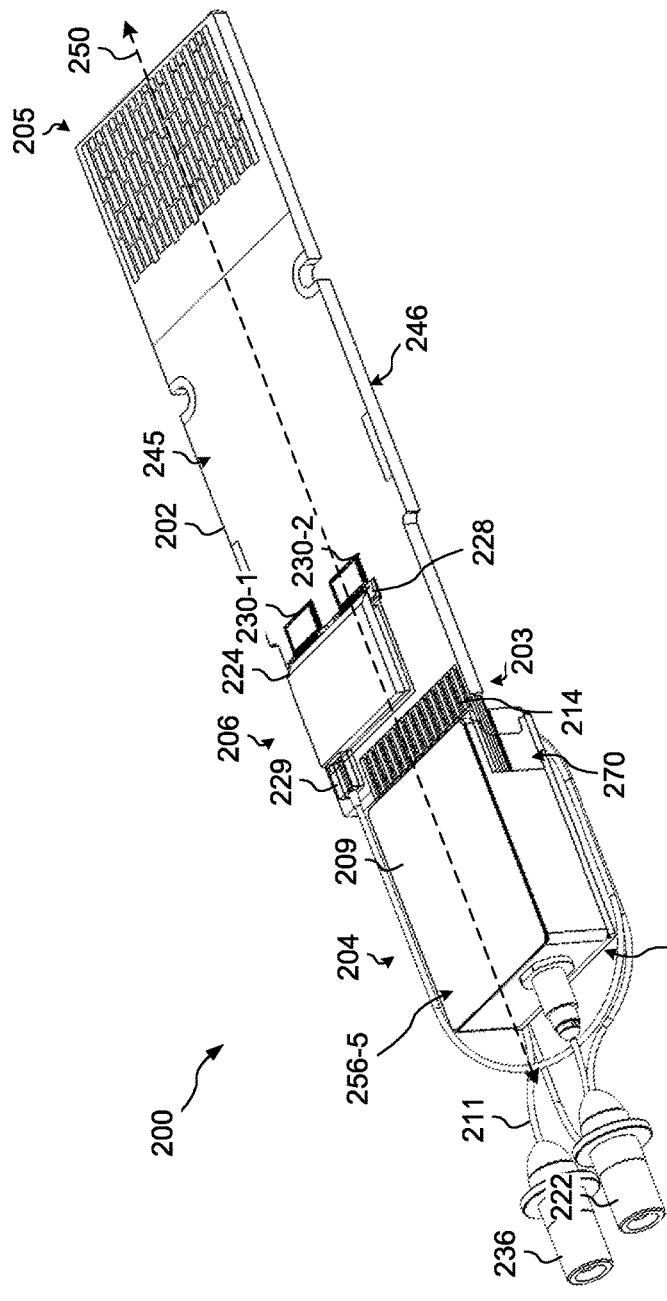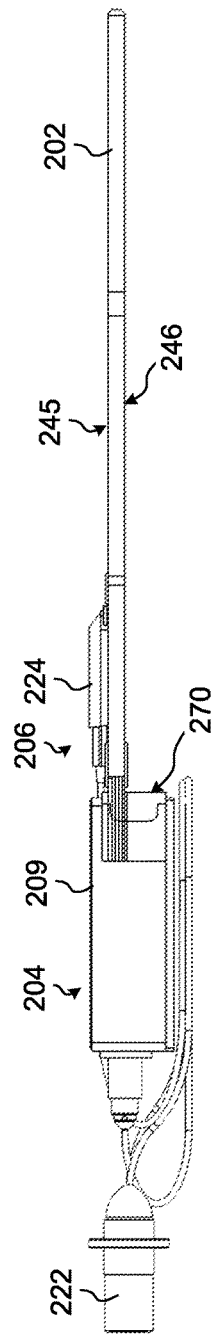

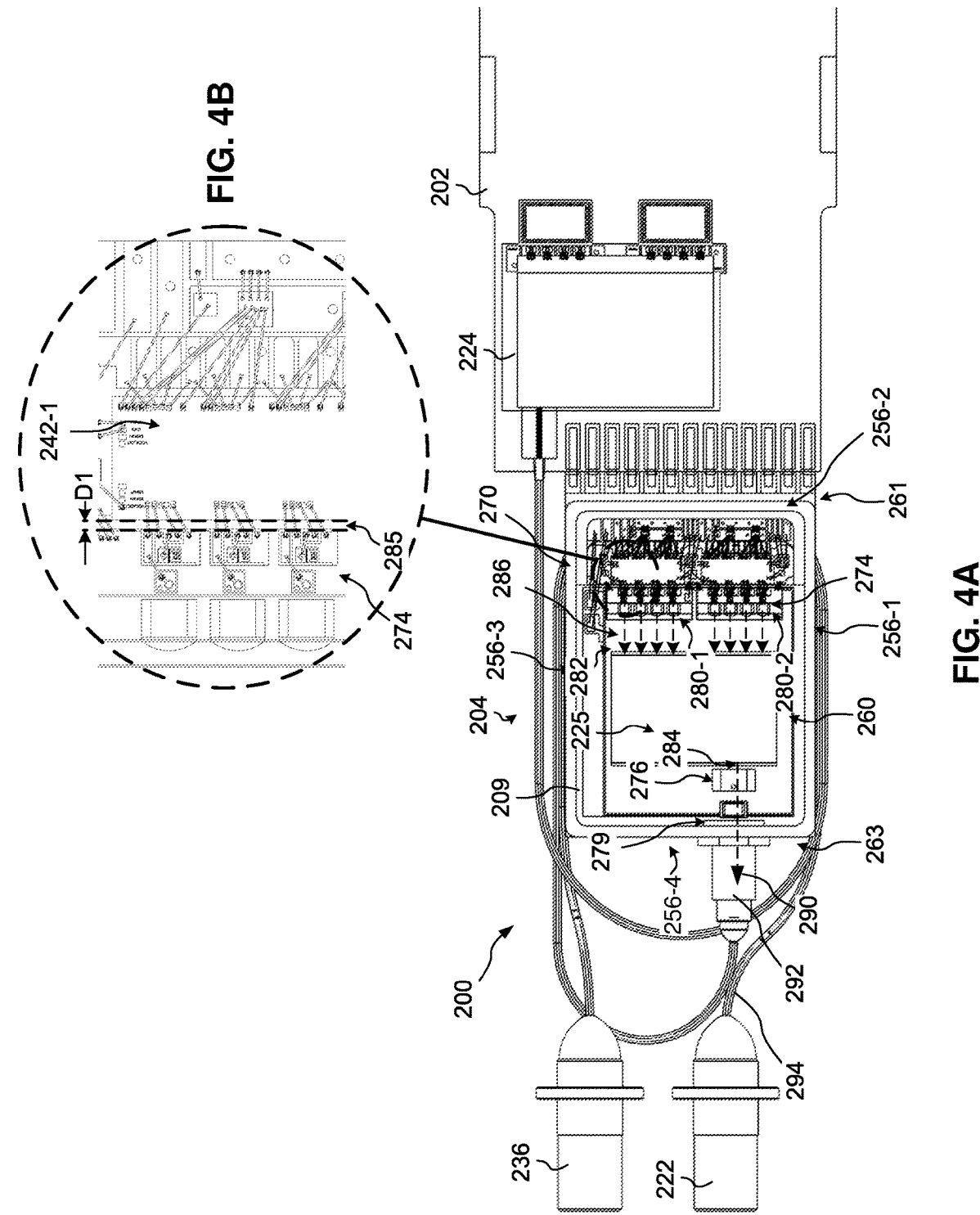

TRANSMITTER OPTICAL SUBASSEMBLY (TOSA) WITH LASER DIODE DRIVER (LDD) CIRCUITRY MOUNTED TO FEEDTHROUGH OF TOSA HOUSING

TECHNICAL FIELD

The present disclosure relates to optical communications and more particularly, to a transmitter optical subassembly (TOSA) having a laser diode driver (LDD) and associated circuitry mounted to a feedthrough of a housing of the TOSA.

BACKGROUND INFORMATION

Optical transceivers are used to transmit and receive optical signals for various applications including, without limitation, internet data center, cable TV broadband, and fiber to the home (FTTH) applications. Optical transceivers provide higher speeds and bandwidth over longer distances, for example, as compared to transmission over copper cables. The desire to provide higher transmit/receive speeds in increasingly space-constrained optical transceiver modules has presented challenges, for example, with respect to thermal management, insertion loss, RF driving signal quality and manufacturing yield.

Optical transceiver modules generally include one or more transmitter optical subassemblies (TOSAs) for transmitting optical signals. TOSAs can include one or more lasers to emit one or more channel wavelengths and associated circuitry for driving the lasers. Some optical applications, such as long-distance communication, can require TOSAs to include hermetically-sealed housings with arrayed waveguide gratings, temperature control devices, laser packages and associated circuitry disposed therein to reduce loss and ensure optical performance. However, the inclusion of hermetically-sealed components increases manufacturing complexity, cost, and raises numerous non-trivial challenges within space-constrained housings.

BRIEF DESCRIPTION OF THE DRAWINGS

These and other features and advantages will be better understood by reading the following detailed description, taken together with the drawings wherein:

FIG. 2 is a perspective view of a multi-channel optical transceiver module consistent with the present disclosure.

FIG. 3 is a side view of the multi-channel optical transceiver module of FIG. 2, consistent with an embodiment of the present disclosure.

FIG. 4A shows a top-down view of a multi-channel TOSA arrangement of the multi-channel optical transceiver module of FIG. 2, in accordance with an embodiment of the present disclosure.

FIG. 4B shows an enlarged portion of the multi-channel TOSA arrangement of FIG. 4A.

DETAILED DESCRIPTION

Figure 1:
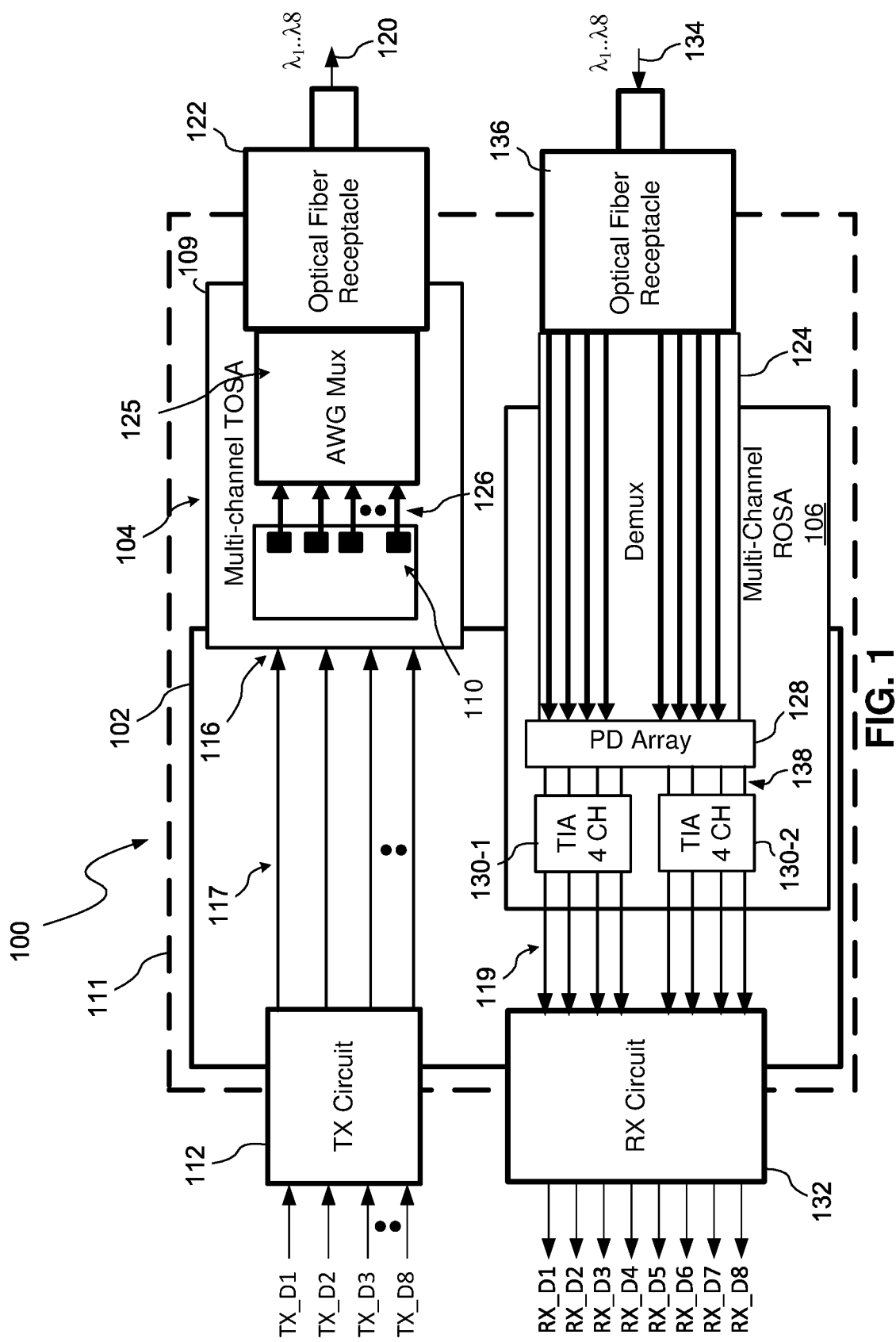
FIG. 1 is a block diagram of a multi-channel optical transceiver, consistent with embodiments of the present disclosure.
Figure 5:
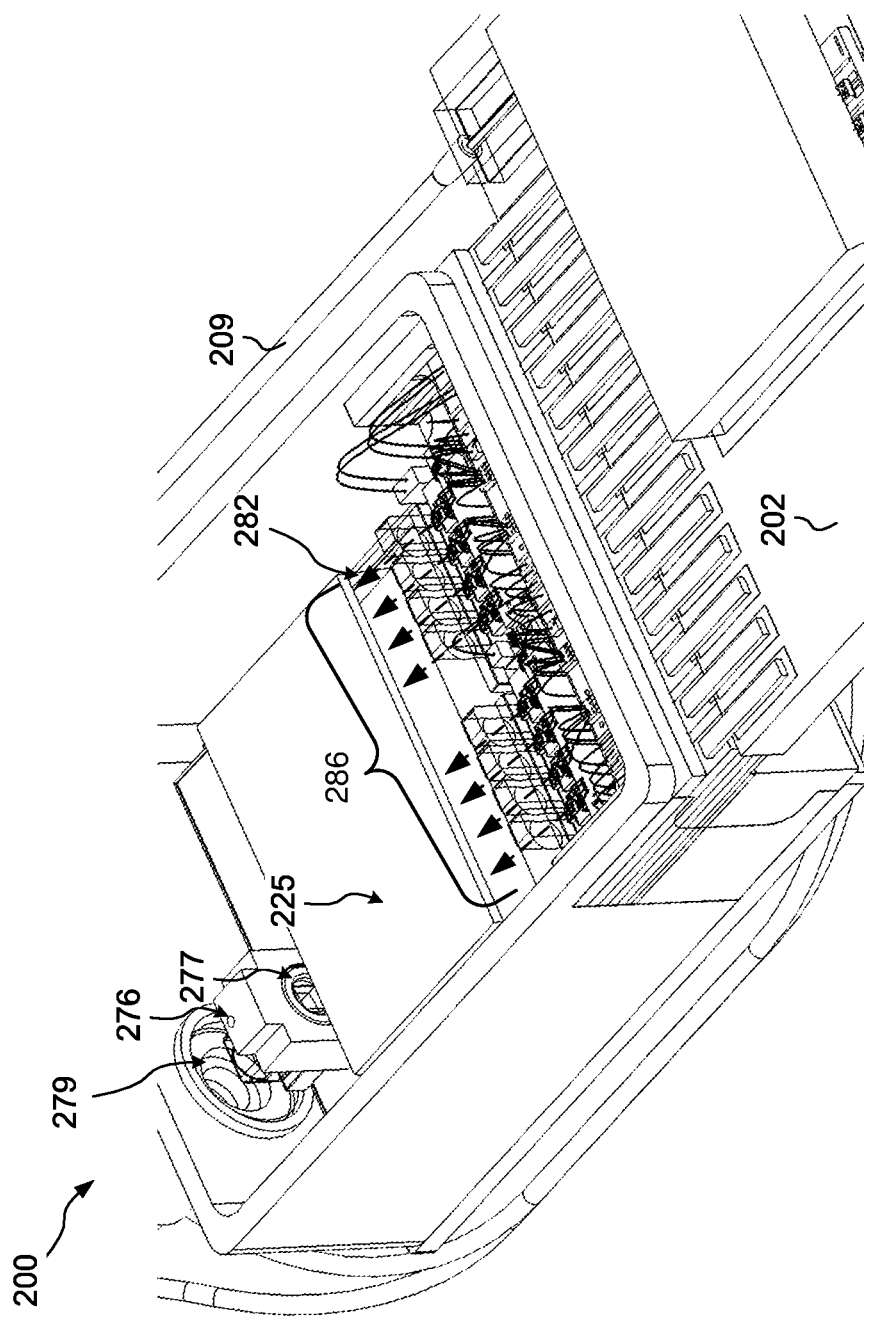
FIG. 5 shows another perspective view of the multi-channel TOSA arrangement of FIG. 4A in accordance with an embodiment of the present disclosure.

As discussed above, significant challenges limit increased channel configurations of optical transceiver modules beyond four (4) channels to achieve transmission speeds in excess of 100 gb/s. One such challenge includes designing transmitter optical subassembly (TOSA) housings with footprints as small as possible while also providing sufficient space to allow for mounting of components and distances between optical components that facilitates thermal dissipation, reduce electrical interference, and maintains radio frequency (RF) driving signal integrity, for example.

In the context of multi-channel TOSAs with channel counts in excess of four (4), these challenges can be further exacerbated by the duplication of some optical components to achieve a desired channel count. For instance, LDD chips are often limited to driving four or less channels, thus necessitating redundantly including two LDD chips and supporting circuitry to facilitate, for instance, eight (8) total channels. These considerations and challenges are of significant import in TOSA designs that utilize hermetically-sealed housings as a substantial portion of the overall cost to manufacture each TOSA is directly related to the dimensions/volume of the hermetically-sealed cavity. Continued scaling of hermetically-sealed TOSA housings thus depends in part on TOSA circuitry configurations (both inside and outside of the TOSA housing) that achieve nominal power, RF signal quality, and thermal dissipation requirements, while also minimizing the volume of the hermetically-sealed cavity.

Thus, the present disclosure is generally directed to a multi-channel TOSA arrangement with a housing that utilizes a feedthrough device with at least one integrated mounting surface. In more detail, the housing includes a plurality of sidewalls that define a hermetically-sealed cavity therebetween. The feedthrough device includes a first end disposed in the hermetically-sealed cavity of the housing and a second end extending from the cavity away from the housing. The feedthrough device provides the at least one integrated mounting surface, which may be referred to herein as simply a mounting surface, proximate the first end within the hermetically-sealed cavity. At least a first laser diode driver (LDD) chip mounts to the at least one integrated mounting surface of the feedthrough device. A plurality of laser arrangements are also disposed in the hermetically-sealed cavity proximate the first LDD chip and mount to, for instance, a LD submount supported by a thermoelectric cooler (TEC). Each of the laser arrangements of the plurality of laser arrangements electrically couples to the first LDD chip via, for example, wire bonds.

In an embodiment, the at least one integrated mounting surface of the feedthrough device includes a multi-step profile whereby first and second mounting surfaces extend substantially parallel to each other and substantially transverse relative to a surface that adjoins the two. In this embodiment, at least a first LDD chip mounts to the first or the second mounting surface and at least one filtering capacitor couples to the other of the first or the second mounting surface. Accordingly, the multi-step profile permits LDD chips and filtering capacitors to physically and electrically mount to the feedthrough devices on different steps/tiers. The LDD chips and filtering capacitors then electrically couple to the plurality of laser arrangements by way of, for example, wire bonds.

Numerous advantageous will be apparent in light of the present disclosure relative to other TOSA design approaches. For example, the at least one integrated mounting surface of the feedthrough device allows for one or more LDD chips to be mounted thereon within the hermetically-sealed housing rather than on a printed circuit board (PCB) or other location within the TOSA housing. Accordingly, the space which LDD chips normally occupy within the hermetically-sealed housing becomes available for other optical components to be mounted such as the plurality of laser arrangements. This advantageously permits the plurality of laser arrangements to be disposed proximate the feedthrough device, e.g., without LDD chips therebetween, while also maintaining a relatively short distance to the LLD chips. The TOSA housing, and by extension the hermetically-sealed cavity, may then be reduced in overall length as the substrate/submount supporting the TOSA optical components can be shortened as a result of the feedthrough device providing mounting surfaces for the LDD chip and/or filtering capacitors. Likewise, the feedthrough device can provide mounting space for filtering capacitors that significantly improve TOSA performance. Thus, a multi-channel TOSA consistent with the present disclosure allows for inclusion of filtering capacitors that are often omitted intentionally for space-saving purposes.

The feedthrough device with the one more integrated mounting surfaces further advantageously provides thermal isolation between the laser arrangements and the LDD chips. For example, the feedthrough device can provide a thermal conduction path separate and isolated from a thermal conduction path of the plurality of laser arrangements. The thermal conduction path of the feedthrough device also allows for greater dissipation by virtue of the material forming the device, e.g., ceramic. Accordingly, less power may be consumed by a multi-channel TOSA consistent with the present disclosure during operation based on the TEC being utilized to cool the plurality of laser arrangements rather than both the plurality of laser arrangements and LDD chips.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. This disclosure is equally applicable to coarse wavelength division multiplexing (CWDM). In one specific example embodiment, the channel wavelengths are implemented in accordance with local area network (LAN) wavelength division multiplexing (WDM), which may also be referred to as LWDM.

The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals. On the other hand, the term "direct optical coupling" refers to an optical coupling via an optical path between two elements that does not include such intermediate components or devices, e.g., a mirror, waveguide, and so on, or bends/turns along the optical path between two elements.

The term substantially, as generally referred to herein, refers to a degree of precision within acceptable tolerance that accounts for and reflects minor real-world variation due to material composition, material defects, and/or limitations/peculiarities in manufacturing processes. Such variation may therefore be said to achieve largely, but not necessarily wholly, the stated/nominal characteristic. To provide one non-limiting numerical example to quantify "substantially," such a modifier is intended to include minor variation that can cause a deviation of up to and including ±5% from a particular stated quality/characteristic unless otherwise provided by the present disclosure.

As used herein, the terms hermetic-sealed and hermetically-sealed may be used interchangeably and refer to a housing that releases a maximum of about $5*10^{-8}$ cc/sec of filler gas. The filler gas may comprise an inert gas such as nitrogen, helium, argon, krypton, xenon, or various mixtures thereof, including a nitrogen-helium mix, a neon-helium mix, a krypton-helium mix, or a xenon-helium mix.

Referring to the Figures, FIG. 1, an optical transceiver 100, consistent with embodiments of the present disclosure, is shown and described. The optical transceiver module 100 is shown in a highly simplified form for clarity and ease of explanation and not for purposes of limitation. In this embodiment, the optical transceiver 100 includes a multi-channel transmitter optical subassembly (TOSA) arrangement 104 and a multi-channel receiver optical subassembly (ROSA) arrangement 106 coupled to a substrate 102, which may also be referred to as an optical module substrate. The substrate 102 may comprise, for example, a printed circuit board (PCB) or PCB assembly (PCBA). The substrate 102 may be configured to be "pluggable" for insertion into an optical transceiver cage 111.

In the embodiment shown, the optical transceiver 100 transmits and receives eight (8) channels using eight different channel wavelengths (λ1 ... λ8) via the multi-channel TOSA arrangement 104 and the multi-channel ROSA arrangement 106, respectively, and may be capable of transmission rates of at least about 25 Gbps per channel, and preferably 50 Gbps per channel. The optical transceiver 100 may also be capable of transmission distances of 2 km to at least about 10 km. The optical transceiver 100 may be used, for example, in internet data center applications or fiber to the home (FTTH) applications. Although the following examples and embodiments show and describe a 8-channel optical transceiver, this disclosure is not limited in this regard. For example, the present disclosure is equally applicable to 2, 4, 6-channel configurations.

In more detail, the multi-channel TOSA arrangement 104 includes a TOSA housing 109 with a plurality of sidewalls that define a cavity. The cavity includes a plurality of laser arrangements 110, a multiplexing device 125, and a feedthrough device 116 disposed therein. The multi-channel TOSA arrangement 104 may be implemented as the multi-channel TOSA arrangement 204 of FIGS. 2-7 with at least one laser diode driver (LDD) disposed/mounted on the feedthrough device 116, which will be discussed in greater detail below. In an any event, each laser arrangement of the plurality of laser arrangements 110 can be configured to transmit optical signals having different associated channel wavelengths. Each laser arrangement can include passive and/or active optical components such as a laser diode (LD), optical isolator, focus lens, monitor photodiode (MPD), and so on.

To drive the plurality of laser arrangements 110, the optical transceiver 100 includes a transmit connecting circuit 112 to provide electrical connections to the plurality of laser arrangements 110 within the housing 109. The transmit connecting circuit 112 may be configured to receive driving signals (e.g., TX_D1 to TX_D8) from, for example, circuitry within the optical transceiver cage 111. The housing 109 may be hermetically sealed to prevent ingress of foreign material, e.g., dust and debris. Therefore, a plurality of transit (TX) traces 117 (or electrically conductive paths) may be patterned on at least one surface of the substrate 102 and electrically coupled to a feedthrough device 116 of the TOSA housing 109 to bring the transmit connecting circuit 112 into electrical communication with the plurality of laser arrangements 110, and thus, electrically interconnect the transmit connecting circuit 112 with the multi-channel TOSA arrangement 104. The feedthrough device 116 may comprise, for instance, ceramic, metal, or any other suitable material.

In operation, the multi-channel TOSA arrangement 104 may then receive driving signals (e.g., TX_D1 to TX_D8), and in response thereto, generate and launch multiplexed channel wavelengths on to an output waveguide 120 such as a transmit optical fiber. The generated multiplexed channel wavelengths may be combined based on a multiplexing device 125 such as an arrayed waveguide grating (AWG) that is configured to receive emitted channel wavelengths 126 from the plurality of laser arrangements 110 and output a signal carrying the multiplexed channel wavelengths on to the output waveguide 120 by way of optical fiber receptacle 122.

Continuing on, the multi-channel ROSA arrangement 106 includes a demultiplexing device 124, e.g., an arrayed waveguide grating (AWG), a photodiode (PD) array 128, and amplification circuitry 130, e.g., a transimpedance amplifier (TIA). An input port of the demultiplexing device 124 may be optically coupled with a receive waveguide 134, e.g., an optical fiber, by way of an optical fiber receptacle 136. An output port of the demultiplexing device 124 may be configured to output separated channel wavelengths on to the PD array 128. The PD array 128 may then output proportional electrical signals to the TIA 130, which then may be amplified and otherwise conditioned. The PD array 128 and the transimpedance amplifier 130 detect and convert optical signals into electrical data signals (RX_D1 to RX_D8) that are output via the receive connecting circuit 132. In operation, the PD array 128 may then output electrical signals carrying a representation of the received channel wavelengths to a receive connecting circuit 132 by way of conductive traces 119 (which may be referred to as conductive paths).

Referring to FIGS. 2-7 an example transceiver module 200 is shown consistent with an embodiment of the present disclosure. The example transceiver module 200 may be implemented as the optical transceiver 100 of FIG. 1. As shown, the optical transceiver module 200 includes a configuration to send and receive eight (8) different channel wavelengths in order to provide transmission speeds up to and an in excess of 400 Gb/s, for instance. However, other channel configurations are within the scope of this disclosure and the embodiment of FIGS. 2-7 are not intended to limit the present disclosure.

In more detail, the optical transceiver module 200 includes a substrate 202, multi-channel TOSA arrangement 204, and a multi-channel ROSA arrangement 206. In particular, the substrate 202 includes a first end 203 that extends to a second end 205 along a longitudinal axis 250. A first and second mounting surface 245, 246 disposed facing away from each other extend in parallel along the longitudinal axis 250 and define at least a portion of the substrate 202. The substrate 202 may comprise, for example, a printed circuit board assembly (PCBA) or other suitable substrate material.

The multi-channel ROSA arrangement 206 is coupled to and supported by the first mounting surface 245 at a position proximate the first end 203 of the substrate 202. The multi-channel ROSA arrangement 206 can include on-board/integrated configuration as discussed and described in greater detail in the co-pending U.S. patent application Ser. No. 16/142,466 filed on Sep. 28, 2018 and entitled "Receiver Optical Subassembly (ROSA) Integrated On Printed Circuit Board Assembly," the entirety of which is incorporated herein by reference.

As shown in FIG. 2, the multi-channel ROSA arrangement 206 includes a demultiplexing device 224, e.g., an arrayed waveguide grating (AWG), with an input port 229 coupled to an optical coupling receptacle 236 by way of an intermediate waveguide 211 (e.g., an optical fiber). The demultiplexing device 224 further includes an output region aligned with a photodiode (PD) array 228. The PD array 228 electrically couples to the first and second amplification chips 230-1, 230-2, e.g., transimpedance amplifiers (TIAs). In operation, a multiplexed optical signal received via the optical coupling receptacle 236 gets demultiplexed by the demultiplexer 224. The demultiplexer 224 then outputs separated channel wavelengths on to corresponding photodiodes of the PD array 228. In turn, the PD array 228 outputs an electrical current to the amplification circuitry 230-1, 230-2 that is representative of the received and separated channel wavelengths. The amplification circuitry 230-1, 230-2 then amplifies the electrical currents from the PD array 228 and outputs a signal to, for instance, a data bus via the receive connecting circuit 132 (FIG. 1).

The multi-channel TOSA arrangement 204 is coupled to the first end 203 of the substrate 202 and includes a plurality of laser arrangements and optical connectors for outputting a plurality of channel wavelengths, as discussed in greater detail below. The TOSA arrangement 204 may be edge mounted to the substrate 202, as shown, although other suitable approaches are within the scope of this disclosure.

Turning specifically to the embodiment shown in FIG. 4A, the TOSA arrangement 204 includes a housing 209, which may also be referred to as a TOSA housing. The housing 209 is defined by a plurality of sidewalls 256-1 to 256-6 that define a cavity 260 therebetween. The plurality of sidewalls 256-1 to 256-6 extend from a first end 261 to a second end 263 along the longitudinal axis 250 (FIG. 2). However, the housing 209 may have other shapes and configurations and the provided example is not intended to be limiting.

Figure 6:
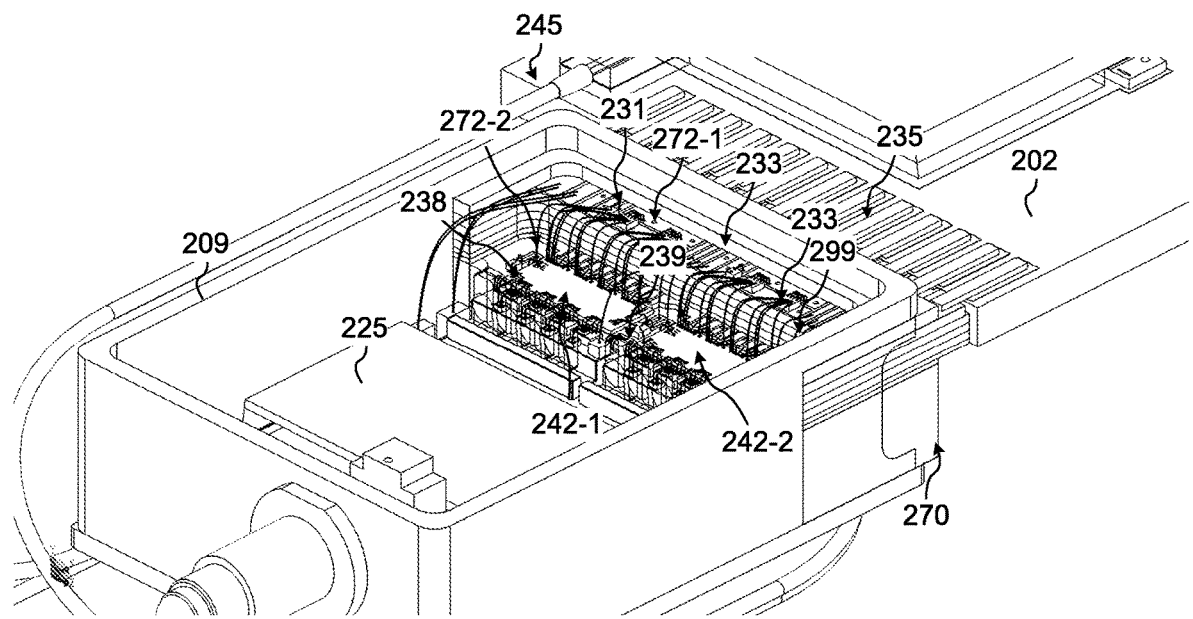
FIG. 6 shows another perspective view of the multi-channel TOSA arrangement of FIG. 4A in accordance with an embodiment of the present disclosure.

As further shown in the embodiment of FIG. 4A, with additional reference to FIG. 6, the TOSA arrangement 204 includes a feedthrough device 270, a plurality of laser arrangements 274, a multiplexing device 225, an optical isolator chip 276 and an output port 279. The feedthrough device 270 is disposed proximate the first end 261 of the housing 209 and extends at least partially into the cavity 260. In particular, a first portion 232-1 of the feedthrough device 270 extends at least partially into the cavity 260 and a second portion 232-2 may extend from the cavity 260 towards the substrate 202 for coupling purposes (see FIG. 6). Accordingly, the feedthrough device 270 defines at least a portion of the cavity 260.

The feedthrough device 270 may comprise, for example, a suitably rigid non-metal material such as inorganic material such as a crystalline oxide, nitride or carbide material, which may be commonly referred to as ceramic. Some elements, such as carbon or silicon, may also be considered ceramics, and are also within the scope of this disclosure.

Following the feedthrough device 270 a plurality of laser arrangements 274 are at least partially disposed on laser diode (LD) submounts 280-1, 280-2. Each laser arrangement of the plurality of laser arrangements 274 includes a laser diode, a monitor photodiode, and a focus lens. Each laser arrangement also includes a corresponding LD driver (LDD) chip 242 mounted to the feedthrough device 270. For example, as shown in the enlarged region of FIG. 4B, each of the laser arrangements 274 can include a laser diode that is disposed at a substantially uniform distance of D1 from an associated LDD chip, e.g., LDD chip 242-1. The embodiment of FIG. 4B also shows that each of the plurality of laser diodes 274 and associated LDD chip, e.g., LDD chip 242-1, may be mounted in a manner that causes the same to extend directly up to the edge of their respective mounting surfaces. To this end, only a relatively small air gap 285 (also having an overall width of D1) separates each of the laser diodes 274 and the associated LDD chips 242. As discussed in greater detail, the proximity of each LD chip to an associated LDD chip can significantly shorten the length of an interconnect device between the same, such as a wire bond. In addition, the gap 285 can advantageously provide thermal isolation.

Following the plurality of laser arrangements 274, a multiplexing device 225 is disposed at a midpoint within the cavity 260. In particular, the multiplexing device 225 includes an input region 282 facing the first end 261 of the housing 209, and more particularly the plurality of laser arrangements 274. The input region 282 includes a plurality of input ports (not shown) that are aligned to receive channel wavelengths from LDs along an associated light path. Each of the laser arrangements 274 may then emit associated channel wavelengths on a corresponding light path of a plurality of input light paths 286 that intersect with the input region 282, which is more clearly shown in FIG. 5. Each light path of the plurality of light paths 286 therefore extends from an emission surface of an associated LD through a focus lens, and then ultimately to the input region 282.

The multiplexing device 225 further includes an output port 284 that is disposed opposite the input region 282 such that the output port 284 faces the second end of the housing 209. The output port 284 outputs a multiplexed signal along an output light path 290. An optical isolator 276 proximate the second end 263 of the housing 209 includes an aperture 277, by which the output light path 290 extends therethrough. Following the optical isolator 276, the housing 209 includes an opening/aperture for coupling to an optical coupling receptacle 292. The optical coupling receptacle 292 optically couples with the transmit optical coupling receptacle 222 by way of an intermediate fiber 294. Accordingly, the multiplexing device 225 outputs a multiplexed optical signal for transmission via light path 290.

Turning to FIG. 6, additional aspects of a feedthrough device 270 consistent with the present disclosure are shown. As shown, feedthrough device 270 may be defined by at least a first mounting surface 272-1 and a second mounting surface 272-2. Although denoted as "first" and "second," these designations are merely for purposes of clarity and are utilized simply to distinguish between the mounting surfaces 272-1, 272-2. To this end, either mounting surface may be referred to as a "first" or "second" surface. In any event, the first and second mounting surfaces 272-1, 272-2 may be formed integrally with the feedthrough device 270 as a single piece, e.g., allowing for direct coupling of components to the feedthrough device 270. However, in some cases the first and second mounting surfaces 272-1, 272-2 may be provided by one or more submounts. In either case, the feedthrough device 270 advantageously provides mounting regions that facilitate such direct or indirect mounting and support of components.

Continuing on, the first and second mounting surfaces 272-1, 272-2 may be substantially planar, such as shown, although the first and second mounting surfaces 272-1, 272-2 are not limited in this respect and other embodiments are within the scope of this disclosure. The first and second mounting surfaces 272-1, 272-1 extend in parallel relative to each other but are offset by a distance D (see FIG. 7) to provide a step structure or profile. To this end, the arrangement of the first and second mounting surfaces 272-1, 272-2 may collectively provide a "stepped," or multi-step mounting profile whereby the first and second mounting surfaces are adjoined by a surface 299 that extends substantially transverse to each and provides the offset distance D. The offset distance D may measure between 10 and 130 microns, and preferably 100 microns although other distances are within the scope of this disclosure.

The first mounting surface 272-1 may be substantially coplanar with the first mounting surface 245 of the substrate 202, or not, depending on a desired configuration. This may advantageously allow for electrical traces 233 disposed/patterned on the first mounting surface 272-1 to electrically couple with the substrate 202 via an interconnect device such as the bus bars 235. Power and RF signals may be then provided to the TOSA arrangement, and more particularly, optical components disposed within the cavity 260 of the housing 9. Accordingly, the first mounting surface 272-1 may also be referred to as a feedthrough mounting surface as at least a conductive portion of the same, e.g., the conductive traces patterned thereon, extends out from the cavity 260 of the housing 209. The first mounting surface 272-1 includes a plurality of filtering capacitors 231 mounted thereon. The filtering capacitors 231 may be utilized when driving the plurality of laser arrangements to maintain signal integrity, e.g., by reducing noise, stabilizing the DC signal, for example.

On the other hand, the second mounting surface 272-2 is disposed within the cavity 260 of the housing 209 and is disposed at the offset D from that of the first mounting surface 272-1. The second mounting surface 272-2 may be accurately referred to as an internal mounting surface or a recessed mounting surface whereby the mounting surface 272-2 is fully within the cavity 260 of the housing 209 and below the first mounting surface 272-1. In addition, the second mounting surface 272-2 be vertically offset from the laser diode (LD) submounts 280-1, 280-2 such that the LD submounts 280-1, 280-2 are below a horizontal plane extending from the second mounting surface 272-2 (see FIG. 7). In other embodiments, the second mounting surface 272-2 may be substantially coplanar with and proximate to the LD submounts 280-1, 280-2.

Continuing with FIG. 6, wire bonds 238 electrically couple the first and second LDD chips 242-1, 242-2 to laser diodes of the plurality of laser arrangements 274 and are relatively short to advantageously reduce issues such as time of flight (TOF) and impedance mismatches, for example. Electrical interconnects other than wire bonds may be utilized, and the example embodiment of FIG. 6 should not be construed as limiting.

The first and second LDD chips 242-1, 242-2 can electrically couple to the plurality filtering capacitors 231 via wire bonds, for instance, although other types of interconnects are within the scope of this disclosure. In addition, the plurality of laser arrangements 274 electrically couple to the electric traces 239 of the second mounting surface 272-1.

The electrical traces 239 then couple to the traces 233 of the first mounting surface 272-1, and ultimately circuitry of the substrate 202, to complete an electrical circuit for RF and power signals.

Figure 7:
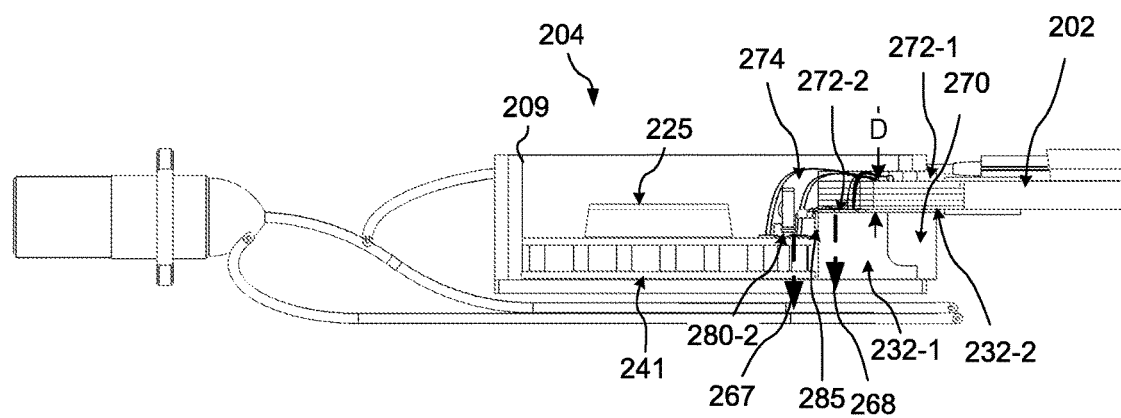
FIG. 7 shows a cross-sectional view of the multi-channel TOSA arrangement of FIG. 4A in accordance with an embodiment of the present disclosure.

The cross-sectional view of FIG. 7 shows additional aspects of the multi-channel TOSA arrangement 204 in accordance with an embodiment. As shown, the multiplexing device 225 and the plurality of laser arrangements 274 are supported by a thermoelectric cooler (TEC) 241. To this end, the TEC 241 can provide one or more mounting surfaces to couple to active and/or passive optical components. The plurality of laser arrangements 274 mount/couple to the TEC 241 via the LD submount 266, as shown, or can directly mount to the TEC 241 depending on a desired configuration.

As further shown, first and second LD chips 242-1, 242-2 couple to and are supported by the second mounting surface 272-2. The first and second LDD chips 242-1, 242-2 are therefore in thermal communication with the housing 209 via feedthrough device 270 for heat dissipation purposes. As shown in the embodiment of FIG. 7, an air gap 285 separates the first and second LDD chips 242-1, 242-2 from the plurality of laser arrangements 274. Accordingly, the plurality of laser arrangements 274 are in thermal communication with the housing 209 and/or the TEC 241 via a first thermal conduction path 267 to dissipate heat. On the other hand, the LDD chips 242 are in thermal communication with the housing 209 via a second thermal conduction path 268 provided at least in part by the feedthrough device 270 that extends from the mounting surfaces 272-1, 272-2 to the metal housing 209 to dissipate heat. The first and second thermal conduction paths 267, 268 are separate and distinct, which provides thermal isolation from each other as well as other components of the multi-channel TOSA arrangement 204. Accordingly, less power may be consumed by the TEC 241 to ensure nominal performance of the multi-channel TOSA arrangement 204 based on the feedthrough device 270 dissipating heat communicated from the first and second LDD chips and/or filtering capacitors 231.

In operation, the multi-channel TOSA arrangement 204 receives an RF driving signal and power from the substrate 202. In particular, the optical components such as the plurality of laser arrangements 274 receive the RF driving signal and power via the traces 233, 239. In response, the plurality of laser arrangements 274 then modulate and launch channel wavelengths based on the received RF driving signal. The channel wavelengths are then received at the input region 282 of the multiplexing device 225. The multiplexing device 225 then multiplexes the received channel wavelengths and outputs a multiplexed signal to the transmit optical coupling receptacle 222 by way of output port 284 and intermediate fiber 294.

In accordance with an aspect of the present disclosure a transmitter optical subassembly (TOSA) arrangement is disclosed. The TOSA arrangement comprising a housing having a plurality of sidewalls that define a cavity therebetween, a feedthrough device having a first end disposed in the cavity of the housing and a second end extending from the cavity away from the housing, the feedthrough device providing at least a first mounting surface proximate the first end within the cavity, a first diode driver (LDD) chip mounted to the first mounting surface of the feedthrough device, and a plurality of laser arrangements disposed in the cavity, each of the plurality of laser arrangements electrically coupled to the feedthrough device to receive a radio frequency (RF) driving signal from the LDD.

In accordance with another aspect of the present disclosure a multi-channel transceiver module is disclosed. The multi-channel transceiver module comprising a substrate having at least a first mounting surface for coupling to optical components, a multi-channel transmitter optical subassembly (TOSA) arrangement electrically coupled to the substrate, the multi-channel TOSA arrangement comprising a housing having a plurality of sidewalls that define a hermetically-sealed cavity, a feedthrough device having a first portion extending into the cavity and a second portion extending away from the cavity towards the substrate, a first laser diode driver (LDD) chip within the hermetically-sealed cavity and mounted to the first portion of the feedthrough device, a plurality of laser arrangements disposed within the cavity proximate the LDD chip, a plurality of electrical interconnects electrically coupling each of the plurality of laser arrangements to the LDD chip, and a multiplexing device disposed within the cavity having an input region for receiving channel wavelengths from the plurality of laser arrangements and an output for launching a multiplexed optical signal having the received channel wavelengths on to a transmit optical fiber, a receiver optical subassembly (ROSA) coupled to the substrate.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. A transmitter optical subassembly (TOSA) arrangement, the TOSA arrangement comprising:
    a housing having a plurality of sidewalls that define a hermetically-sealed cavity therebetween;
    a feedthrough device having a first end disposed in the hermetically-sealed cavity of the housing and a second end extending from the hermetically-sealed cavity away from the housing, the feedthrough device providing at least first and second mounting surfaces proximate the first end within the hermetically-sealed cavity, wherein the first mounting surface is recessed relative to the second mounting surface such that the second mounting surface is disposed at an offset distance D from the first mounting surface to provide a stepped profile;
    at least one laser diode driver (LDD) chip mounted to the first mounting surface of the feedthrough device;
    at least one component mounted to the second mounting surface of the feedthrough device;
    a laser diode (LD) submount disposed within the hermetically-sealed cavity;
    a plurality of laser arrangements disposed in the hermetically-sealed cavity and mounted to the LD submount, each of the plurality of laser arrangements electrically coupled to the feedthrough device to receive a radio frequency (RF) driving signal from the at least one LDD chip,
    wherein the LD submount is separated from the feedthrough device by an air gap such that the plurality of laser arrangements are thermally isolated from the at least one LDD chip mounted to the feedthrough device; and wherein the LD submount and the feedthrough device are mounted to and supported by a sidewall of the plurality of the sidewalls of the housing that underlies each, and wherein the plurality of laser arrangements are in thermal communication with the housing via a first thermal conduction path that extends from the plurality of laser arrangements to the sidewall, and the at least one LDD chip is in thermal communication with the housing via a second thermal conduction path that extends from the first mounting surface of the feedthrough device to the sidewall, and wherein the first and second thermal conduction paths extend substantially parallel with each other along an entirety of their respective lengths.

2. The TOSA arrangement of claim 1, wherein the plurality of laser arrangements each include a laser diode (LD) which are disposed at a substantially uniform distance D1 relative to the feedthrough device.

3. The TOSA arrangement of claim 1, wherein the feedthrough device includes a plurality of electrical traces proximate the second end to electrically couple the plurality of laser arrangements within the hermetically-sealed cavity to associated circuitry external to the hermetically-sealed cavity.

4. The TOSA arrangement of claim 1, wherein the second mounting surface extends substantially parallel with the first mounting surface, and wherein the first and second mounting surfaces collectively define the stepped profile which includes a surface that extends substantially transverse relative to each and adjoins the first and second mounting surfaces.

5. The TOSA arrangement of claim 1, wherein the at least one component comprises at least one filtering capacitor to maintain integrity of the RF driving signal.

6. The TOSA arrangement of claim 1, wherein the at least one LDD chip comprises a first LDD chip and a second LDD chip, the second LDD chip mounted to the first mounting surface of the feedthrough device proximate the first LDD chip, and wherein a first laser arrangement of the plurality of laser arrangements is electrically coupled to the first LDD chip to receive a first RF driving signal and a second laser arrangement of the plurality of laser arrangements is electrically coupled to the second LDD chip to receive a second RF driving signal.

7. The TOSA arrangement of claim 1, further comprising a thermoelectric cooler (TEC) disposed on the sidewall of the housing proximate the feedthrough device, the TEC being separated from the feedthrough device by the air gap, and the LD submount being mounted to the TEC, and wherein the plurality of laser arrangements is thermally coupled with the TEC via the first thermal conduction path provided at least in part by the LD submount, wherein the feedthrough device provides at least a portion of the second thermal conduction path from the first mounting surface to the sidewall of the housing, the first and second thermal conduction paths being thermally isolated from each other based at least in part on the air gap.

8. The TOSA arrangement of claim 1, wherein the second end of the feedthrough device is configured to edge mount to an optical module substrate.

9. A multi-channel transceiver module, the multi-channel transceiver module comprising:
a substrate having at least a first mounting surface for coupling to optical components;
a multi-channel transmitter optical subassembly (TOSA) arrangement electrically coupled to the substrate, the multi-channel TOSA arrangement comprising:

a housing having a plurality of sidewalls that define a hermetically-sealed cavity;
a feedthrough device having a first portion extending into the cavity and a second portion extending away from the cavity towards the substrate, wherein the feedthrough device provides at least first and second mounting surfaces that extend substantially parallel with each other, the first mounting surface being proximate the first portion of the feedthrough device and the second mounting surface being proximate the second portion of the feedthrough device relative to the first mounting surface, and wherein the first mounting surface is recessed relative to the second mounting surface such that the second mounting surface is disposed at an offset distance D from the first mounting surface to provide a stepped profile;
at least one laser diode driver (LDD) chip within the hermetically-sealed cavity and mounted to the first mounting surface of the first portion of the feedthrough device;
at least one component mounted to the second mounting surface of the feedthrough device;
a thermoelectric cooler (TEC) disposed within the hermetically-sealed cavity;
a plurality of laser arrangements disposed within the cavity proximate the at least one LDD chip and mounted to the thermoelectric cooler;
wherein the TEC is separated from the feedthrough device by an air gap such that the plurality of laser arrangements are thermally isolated from the at least one LDD chip mounted to the feedthrough device;
wherein the TEC and the feedthrough device are mounted to and supported by a sidewall of the plurality of sidewalls of the housing that underlies each, and wherein the plurality of laser arrangements are in thermal communication with the housing via a first thermal conduction path that extends from the laser arrangements to the sidewall, and the at least one LDD chip is in thermal communication with the housing via a second thermal conduction path that extends from the first mounting surface of the feedthrough device to the sidewall, and wherein the first and second thermal conduction paths extend substantially parallel with each other along an entirety of their respective lengths;
a plurality of electrical interconnects electrically coupling each of the plurality of laser arrangements to the at least one LDD chip; and
a multiplexing device disposed within the cavity having an input region for receiving channel wavelengths from the plurality of laser arrangements and an output for launching a multiplexed optical signal having the received channel wavelengths on to a transmit optical fiber; and
a receiver optical subassembly (ROSA) coupled to the substrate.

10. The multi-channel transceiver module of claim 9, wherein the at least one component comprises at least one filtering capacitor.

11. The multi-channel transceiver module of claim 9, wherein the first and second mounting surfaces of the feedthrough device collectively define the stepped profile which includes a surface that extends substantially transverse relative to each and that adjoins the first and second mounting surfaces.

12. The multi-channel transceiver module of claim 9, wherein the plurality of laser arrangements couple to the housing via a laser diode (LD) submount, and wherein the LD submount and/or each laser arrangement of the plurality of laser arrangements is disposed at a uniform distance D1 from the feedthrough device.

13. The multi-channel transceiver module of claim 12, wherein the first and second mounting surfaces are in thermal communication with the housing of the multi-channel TOSA arrangement based on the first thermal conduction path that extends through the feedthrough device to the sidewall of the housing, and wherein the LD submount is mounted to the TEC to provide at least a portion of the second thermal conduction path between the TEC and the plurality of laser arrangements, the first and second thermal conduction paths being thermally isolated from each other based at least on the air gap.

14. The multi-channel transceiver module of claim 9, wherein the multi-channel TOSA arrangement is configured to transmit at rates of at least 50 gigabits per second (Gb/s) per channel.

15. The multi-channel transceiver module of claim 9, wherein the at least one LDD chip comprises first and second LDD chips, and wherein the second LDD chip is mounted to feedthrough device, and each of the first and second LDD chips are configured to drive up to four laser arrangements, respectively, of the plurality of laser arrangements.

16. The multi-channel transceiver module of claim 15, wherein the hermetically-sealed cavity of the housing is configured to release up to of $5*10^{-8}$ cc/sec of filler gas.

* * * * *